US005658471A

United States Patent [19]

Murthy et al.

[11] Patent Number: 5,658,471

[45] Date of Patent: Aug. 19, 1997

[54] FABRICATION OF THERMAL INK-JET FEED SLOTS IN A SILICON SUBSTRATE

[75] Inventors: Ashok Murthy; Lawrence Russell Steward; Charles Spencer Whitman, all of Lexington, Ky.

[73] Assignee: Lexmark International, Inc., Lexington, Ky.

[21] Appl. No.: 532,439

[22] Filed: Sep. 22, 1995

[51] Int. Cl.[6] .............................. B44C 1/22; H01L 21/00

[52] U.S. Cl. .............................. 216/27; 216/2; 216/41; 216/56

[58] Field of Search .............................. 156/626.1, 636.1, 156/643.1, 644.1, 645.1, 647.1, 657.1, 659.11; 216/2, 16, 27, 38, 41, 52, 56, 59, 67, 84, 88, 101

[56] References Cited

U.S. PATENT DOCUMENTS

| | | | |
|---|---|---|---|
| 3,921,916 | 11/1975 | Bassous | 239/601 |
| 3,958,255 | 5/1976 | Chiou et al. | 346/140 R |
| 4,007,464 | 2/1977 | Bassous et al. | 346/75 |
| 4,047,184 | 9/1977 | Bassous et al. | 346/75 |
| 4,059,480 | 11/1977 | Ruh et al. | 156/644 |
| 4,066,491 | 1/1978 | Ruh et al. | 156/644 |
| 4,312,008 | 1/1982 | Taub et al. | 346/140 R |
| 4,601,777 | 7/1986 | Hawkins et al. | 156/626 |
| 4,789,425 | 12/1988 | Drake et al. | 156/644 |
| 5,308,442 | 5/1994 | Taub et al. | 156/644 |
| 5,333,831 | 8/1994 | Barth et al. | 251/11 |
| 5,342,808 | 8/1994 | Brigham et al. | 437/228 |
| 5,387,314 | 2/1995 | Baughman et al. | 156/643 |

FOREIGN PATENT DOCUMENTS 0 609 012 A2 8/1994 European Pat. Off. .

OTHER PUBLICATIONS

Ernest Bassous, *IEEE Transactions On Electron Devices*, entitled "Fabrication of Novel Three-Dimensional Microstructures by the Anisotropic Etching of (100) and (110) Silicon", Oct. 1978, vol. ED-25, No. 10, pp. 1178–1185.

Kenneth E. Bean, *IEEE Transactions On Electron Devices*, entitled "Anisotropic Etching of Silicon", Oct. 1978, vol. ED-25, No. 10, pp. 1185–1193.

Kurt E. Petersen, *Proceedings of the IEEE*, entitled "Silicon as a Mechanical Material", May 1982, vol. 70, No. 5, pp. 420–457.

Kazuji Yamada, Motohisa Niahihara, Ryosaku Kanzawa, and Ryoichi Kobayashi, *Sensors and Actuators*, vol. 4, entitled "A Piezoresistive Integrated Pressure Sensor", 1983, pp. 63–69.

W.H. Ko, J.T. Suminto, and G.J. Yeh, *Micromachining and Micropackaging of Transducers*, "Bonding Techniques For Microsensors", (1985), pp. 41–61.

Don. L. Kendall and G.R. de Guel, *Micromachining and Micropackaging of Tranducers*, entitled "Orientations of The Third Kind: The coming of Age of (110) Silicon", (1985) pp. 107–124.

M. Shimbo, K. Furukawa, K. Fukuda, and K. Tanzawa, *Journal of Applied Physics*, entitled "Silicon-to-silicon direct bonding method", Oct. 1986, vol. 60, No. 8, pp. 2987–2989.

G. Kaminsky, *Mat. Res. Soc. Symp. Proc.*, entitled "Micromachining of Silicon Mechanical Structures", (1987), vol. 76, pp. 111–121.

(List continued on next page.)

*Primary Examiner*—William Powell
*Attorney, Agent, or Firm*—John A. Brady

[57] ABSTRACT

Improved methods for fabricating the ink feed slots in silicon substrate for use in thermal ink-jet print heads is disclosed. One method involves the partial anisotropic etching of an ink feed slot in a silicon substrate for use in aligning the electrical resistive elements on one surface of the substrate. Another embodiment involves laser drilling alignment holes and anisotropically etching the substrate. In both methods, at least one photoresist masking and development step is eliminated thereby reducing fabrication time and alignment difficulties for locating the feed slots relative to the electrical resistance elements and increasing product yield.

24 Claims, 8 Drawing Sheets

OTHER PUBLICATIONS

Sharon Begley, Patrick Houston, and Yuriko Hoshiai, *Newsweek*, entitled "Welcome to Lilliput", Apr. 16, 1991, pp. 60–61.

Taoling Wang, Xinyu Zheng, Litian Liu, and Zhijian Li, *IEEE Transaction On Electron Devices*, entitled "A Novel Structure of Pressure Sensors", Aug. 1991, vol. 38, No. 8, pp. 1797–1802.

Stanley Wolf and Richard N. Tauber, *Process Technology*, entitled "Silicon Processing for the VLSI Era", vol. 1, pp. 531–537. (Date Unknown).

Masaki Hirata, Shinobu Suwazono, and Hiroshi Tanigawa, *Journal of the Electrochemical Society: Solid–State Science and Technology*, entitled "Diaphragm Thickness Control in Silicon Pressure Sensors Using an Anodic Oxidation Etch–Stop", Aug. 1987, vol. 134, No. 8, pp. 2037–2041.

Mehran Mehregany, Kaigham J. Gabriel, and William S.N. Trimmer, *IEEE Transactions On Electron Devices*, entitled "Integrated Fabrication of Polysilicon Mechanisms", Jun. 1988, vol. 35, No. 6, pp. 719–723.

Long–Sheng Fan, Yu–Chong Tai, and Richard S. Muller, *IEEE Transactions On Electron Devices*, entitled "Integrated Movable Micromechanical Structures for Sensors and Actuators", Jun. 1988, vol. 35, No. 6, pp. 724–730.

Andrew Pollack, *The New York Times, Science Times*, entitled "New Generation of Tiny Motors Challenges Science to Find Uses", Jul. 26, 1988, pp. 19 and 24.

Orest J. Glembocki, Robert E. Stahlbush, and Micha Tomkiewicz, *Journal of the Electrochemical Society*, entitled "Bias–Dependent Etching of Silicon in Aqueous KOH", Jan. 1985, vol. 132, No. 1, pp. 145–151.

Masaki Hirata, Kenichiro Suzuki, and Hiroshi Tanigawa, *Sensors and Actuators*, entitled "Silicon Diaphragm Pressure Sensors Fabricated By Anodic Oxidation Etch–Stop", (1988), vol. 13, pp. 63–70.

Ben Kloeck, Scott D. Collins, Nico F. DeRooij, and Rosemary L. Smith, *IEEE Transactions On Electron Devices*, entitled "Study of Electrochemical Etch–Stop for High–Precision Thickness Control of Silicon Membranes", Apr. 1989, vol. 36, No. 4, pp. 663–669.

Gilles Delapierre, *Sensors and Actuators*, entitled "Micro–Machining: A Survey of the Most Commonly Used Processes", (1989), vol. 17, pp. 123–138.

Robert Gannon, *Popular Science*, entitled "Micromachine", Mar. 1989, pp. 88–92 and 143.

Christine Harendt, Wolfgang Appel, Heinz–Gerd Graf, Bernd Hofflinger, and Elisabeth Penteker, *Journal of the Electrochemical Society*, entitled "Silicon–on–Insulator films Obtained by Etchback of Bonded Wafers", Nov. 1989, vol. 136, No. 11, pp. 3547–3548.

Roger T. Howe, Richard S. Muller, Kaigham J. Gabriel, and William S.N. Trimmer, *IEEE Spectrum*, entitled "Silicon micromechanics: sensors and actuators on a chip", Jul. 1990, pp. 29–31, 34–35.

Shi–Ji Lu, Zheng Zheng, and Qin–Yi Tong, *Sensors and Actuators*, entitled "A New Silicon Micromachining Method Using SOI/SDB Technology", (1990) A21–A23, pp. 961–963.

Philip W. Barth, *Sensors and Actuators*, entitled "Silicon Fusion Bonding for Fabrication of Sensors, Actuators and Microstructures", (1990), A21–A23, pp. 919–926.

Takao Abe and John H. Matlock, *Solid State Technology*, entitled "Wafer Bonding Technique for Silicon–on–Insulator Technology", Nov. 1990, pp. 39–40.

Stephen C. Jacobsen, John E. Wood, and Richard H. Price, *IEEE Potentials*, entitled "Micromotors split hairs", Feb. 1991, pp. 12–15.

Eric P. Shankland, *Sensors*, entitled "Piezoresistive Silicon Pressure Sensors", Aug. 1991, pp. 22–26.

Jan–Ake Schweitz, *MRS Bulletin*, entitled "Mechanical Characterization of Thin Films by Micromechanical Techniques" Jul. 1992, pp. 34–45.

Gudron Kissinger and Wolfgang Kissinger, *Sensors and Actuators*, entitled "Void–free silicon–wafer–bond strengthening in the 200–400°C. range", (1993), vol. 36, pp. 149–155.

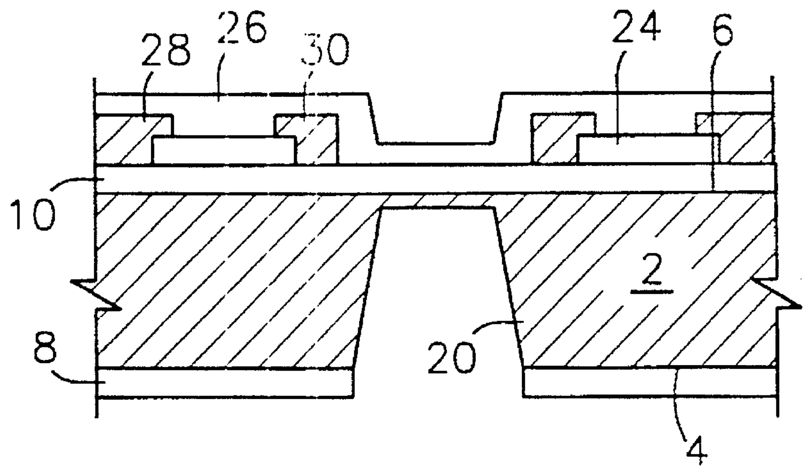
*Fig.* 1E
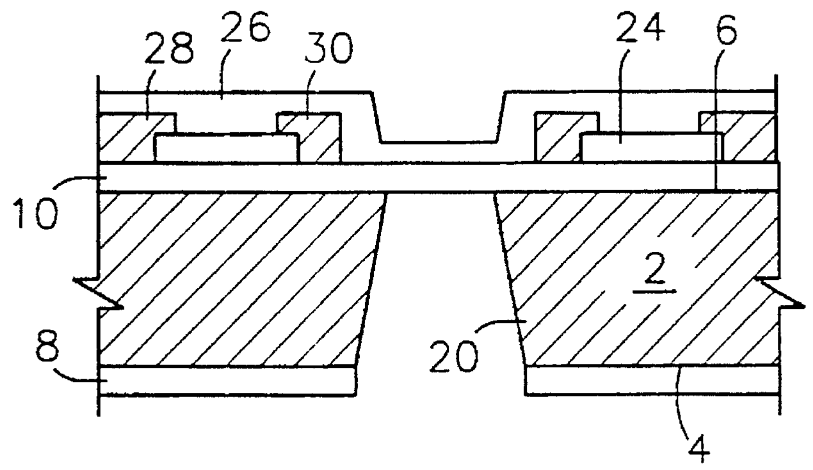
*Fig.* 1F
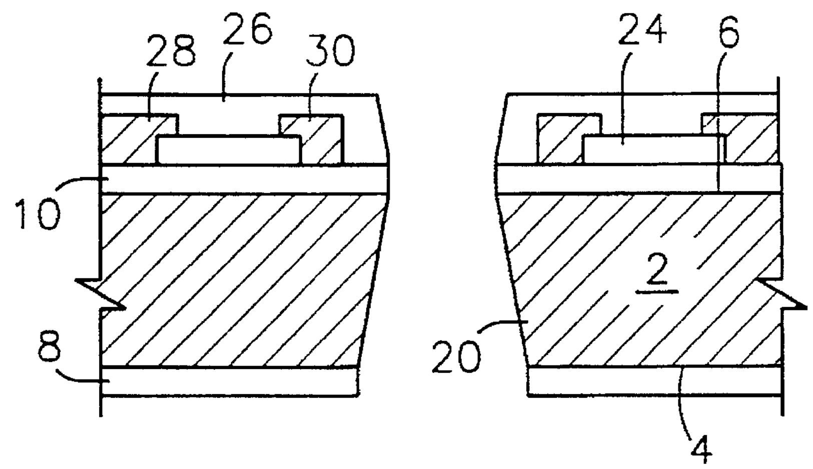
*Fig.* 1G

FABRICATION OF THERMAL INK-JET FEED SLOTS IN A SILICON SUBSTRATE

The present invention relates to thermal ink-jet printheads, more particularly to an improved procedure for making ink feed slots in a silicon substrate used in the construction of thermal ink-jet printheads.

BACKGROUND

Thermal ink-jet printheads typically incorporate a plurality of electrical resistance elements on a common substrate for the purpose of heating ink in adjacent reservoirs in order to vaporize a component of the ink composition. The vaporized component of the ink composition imparts mechanical energy to a quantity of ink thereby propelling the ink through one or more orifices in an orifice plate of the ink-jet printhead toward a print medium in a predefined sequence to form alphanumeric characters and graphics thereon.

In order to provide better print quality, many electrical resistance elements and orifices are provided on a single ink-jet printhead. As the number of electrical resistance elements and orifices on the printhead increase, so does the print quality. However, increasing the number of electrical resistance elements and orifices on a single ink-jet printhead also increases the manufacturing difficulties associated with alignment tolerances of photomasks which must be maintained during fabrication in order to etch the substrate in the desired manner.

On a micro-scale, the ink-jet printhead must be precisely manufactured so that the components of the printhead cooperate to achieve the desired function and give the desired print quality. Hence, alignment of the ink feed slots, electrical resistance elements and orifices is critical to the proper operation of the ink-jet print head. The ink feed slots provide ink from a reservoir to the electrical resistance elements during the printing process. Since the printheads are precise micro-structural devices, even minor deviations or manufacturing difficulties during production of the ink-jet printhead components may result in a loss of useable substrate material and thus a low product yield.

One of the manufacturing technique used for forming ink feed slots in a silicon substrate of a thermal ink-jet printhead is an anisotropic etching technique. In this process, a silicon wafer having parallel (100) crystallographic planes is anisotropically etched to produce an elongated slot having a length ranging from about 3 to about 5 millimeters, a width ranging from about 0.5 to 2 millimeters and side walls which are at an angle of about 54.7° from the planar surface of the silicon wafer. Prior to completion of the printhead, electrical resistance elements and electrodes are attached to one surface of the silicon substrate adjacent the ink feed slots. Manufacturing difficulties are often encountered when attempting to precisely position the feed slots and electrical resistance elements relative to one another.

U.S. Pat. No. 5,387,314 to Baughman et al. discloses a method for making ink fill slots in a silicon substrate. The disclosed procedure includes a partial anisotropic etch from one surface of the silicon substrate whereby the fill slots are etched only part way through the substrate. In a subsequent step, an isotropic etchant is used to complete the fill slots from the opposing surface of the substrate. According to Baughman et al., isotropically etching the silicon from the opposing surface of the substrate reduces the distance from the ink fill slot to the entrance of the ink feed channel. While the method Baughman et al. may reduce the effect of alignment problems in the manufacture of ink fill slots relative to the electrical resistance elements, it requires that the fill slots be extended to the firing chamber on the opposing surface of the substrate by use of a subsequent masking and isotropic etching step. Thus, the procedure requires a combination of etching procedures with multiple alignment of photo-masks which may make the manufacturing of the ink-jet printheads more difficult, costly and subject to alignment errors.

U.S. Pat. No. 5,308,442 to Taub et al. relates to another method for making printhead structures for introducing ink into the firing chambers of the printhead. In this process, a fragile membrane layer having a thickness of about 1 to 2 microns of dielectric material covers an etched ink fill slot until the resistors are formed and then the membrane is removed. As with many other manufacturing processes, the substrate having a membrane covering the ink fill slot must be handled with extreme care in order to avoid puncturing the membrane before the resistors are formed on the surface of the substrate. At high production rates, the yield of product using this technique may be unacceptably low.

U.S. Pat. No. 4,789,425 to Drake et al. relates to yet another method for fabricating thermal ink-jet printheads. The method disclosed by Drake et al. requires the use of etched alignment holes for use in patterning the silicon substrate for the fill slot etching process and for locating the position of the electrical resistance elements on the circuit side of the silicon substrate.

In the disclosed procedure, Drake et al. first patterns then partially or completely anisotropically etches the alignment holes and partially etches the reservoir/fill slots in the substrate. After partially etching the reservoir/fill slots, the resistance circuits are formed on the wafer. In another embodiment, Drake et al. completely etches the alignment holes through the substrate, the resistance circuits are formed then passivated, and the reservoir/fill slots are then patterned and etched in the substrate. Accordingly, Drake et al. require several critical aligning and patterning steps for locating the alignment holes, reservoir/fill slots and electrical resistance elements.

Since alignment steps are often performed manually, the use of multiple alignment steps adds to the labor costs, increases failure rate and slows down the production rate of the etched substrate parts. As the print speed and print quality of the ink-jet printers is increased, the fabrication tolerances become even more critical making the use of multiple masking and etching steps even less reliable for locating the position of the reservoir/fill slots and electrical resistance elements.

An object of the present invention is to provide an improved method for making ink feed slots for ink-jet printheads.

Another object of the invention is to improve the fabrication technique for forming ink feed slots for use in ink-jet printheads whereby the yield of acceptable product is increased.

A still further object of the invention is to provide an improved method for increasing the accuracy of locating electrical resistance elements relative to the ink feed slots of an thermal ink-jet printhead.

Another object of the invention is to reduce alignment difficulties and process steps thereby decreasing the time and increasing the yield of useable substrates for thermal ink-jet printheads.

SUMMARY OF THE INVENTION

With regard to the above and other objects, the present invention provides improved methods for making ink feed slots in a single crystal silicon wafer substrate having first and second surfaces with (100) or (110) crystallographic orientations. At least the second surface of the silicon wafer substrate contains a oxidized layer of $SiO_2$ and, typically both surfaces of the substrate may contain an oxidized layer of $SiO_2$. Prior to etching the substrate, one or both surfaces of the substrate may be polished. In one preferred embodiment, only the second surface (device side) of the silicon substrate is polished.

The feed slots which are etched in the silicon wafer substrate provide fluid communication between an ink reservoir and one or more ink feed channels leading to electrical resistance elements on the second surface of the silicon wafer substrate. In an initial step of the fabrication method, the first surface of the silicon wafer substrate and/or oxidized layer on the first surface is coated with a mask layer which may be formed from $Si_3N_4$, $SiO_2$, SiC or any other suitable masking material, preferably $Si_3N_4$ which is patterned and developed to define locations on the first surface for the ink feed slots.

Next, a portion of the mask layer and the oxidized layer if present, on the first surface of the silicon substrate is removed in the predefined pattern thereby defining the ink feed slot positions. Once the feed slot positions have been defined, the silicon substrate is partially anisotropically etched where the mask layer has been removed so that no more than about 30 microns, preferably from about 5 to about 30 microns, and most preferably about 10 to about 20 microns of substrate remain between the etched slot and the second surface of the substrate.

Subsequent to partially etching the substrate, one or more layers, each of which may contain arrays of resistive material, conductive material, insulative material or a combination of resistive, conductive and insulative materials are deposited and patterned on the second surface of the substrate using the partially etched feed slots for aligning and patterning the one or more layers. Alignment may be obtained using a white light from a standard mask aligner by illuminating the substrate from the first surface (back side) so that the feed slot locations may be seen from the device side.

After depositing and patterning the one or more layers of resistive, conductive and insulative materials on the second surface, one or more protective coatings of a passivation material selected from SiC, $Si_3N_4$, $SiO_2$ or the like are deposited on the second surface to protect the layers during subsequent etching steps. The anisotropic etch of the feed slot is then completed up to the thermally oxidized layer on the second surface and the blanket protective coatings on the second surface are removed by wet or dry etching techniques. In order to complete the fluid flow path through the feed slot, any remaining protective coatings and oxidized layer over the feed slot on the second surface of the substrate are removed, preferably by air or water blast techniques. In the alternative, the blanket protective coating on the second surface may be removed after completing the fluid flow path through the feed slots.

By only partially etching the feed slot so that from about 10 to about 20 microns of substrate remain, the entire second surface of the substrate remains structurally sound thereby reducing the incidence of puncture of the dielectric layer during the deposition and patterning steps conducted on the second surface or other wafer processing steps prior to completing the ink feed slot. Furthermore, initial processing steps required for patterning and etching separate alignment holes are eliminated thereby reducing fabrication time and the chances for misalignment of the device side elements relative to the ink feed slots.

In another embodiment, the invention provides a method for fabricating a topshooter type thermal ink-jet printhead for use in an ink-jet printing device. In the initial step of the process, a plurality of alignment holes are drilled through an oxidized silicon wafer substrate using a laser beam, each hole having an entry on a first surface of the substrate with a diameter of from about 5 to about 100 microns, preferably about 50 microns, and an exit on a second surface of the substrate having a diameter of from about 5 to about 50 microns, preferably about 25 microns.

One or more layers, each of which may contain arrays of resistive material, conductive material, insulative material or a combination of resistive, conductive and insulative materials are deposited and patterned on the second oxidized surface of the substrate using the drilled alignment holes for alignment and patterning of the one or more layers. The conductive materials contain a plurality of electrodes formed from metal such as Al or Cu for contacting and energizing the heating elements. In order to protect the layers of resistive, conductive and insulative materials during the etching steps, these layers are passivated with one or more passivation layers selected from $SiO_2$, $Si_3N_4$, SiC or other suitable passivation material. A tantalum layer is then deposited on the one or more passivation layers and the entire second surface is coated with a protective blanket layer or passivation layer to protect the devices against etchants used to etch the feed slots. The protective blanket layer may be selected from SiN, SiC, $SiO_2$ or any other suitable material known in the art.

After depositing the protective blanket layer on the one or more passivation layers and tantalum layer on the second surface, a plurality of elongate marks are patterned in the oxidized layer on the first surface of the substrate using the alignment holes to define the position of the marks. The first surface is then anisotropically etched according to the predefined pattern of elongate marks thereby producing a plurality of elongate ink feed slots which terminate at the oxidized layer on the second surface of the substrate. After completing the feed slot etching process, the protective blanket layer and oxidized layer on the second surface may be removed by wet or dry etch techniques or other techniques known to those in the art.

An advantage of this embodiment of the invention is the elimination of the patterning and etch steps required for forming alignment holes in the silicon substrate. Furthermore, the laser drilled alignment holes may be more carefully controlled and sized as compared to etching techniques for the alignment holes. Since the alignment holes may be made more precisely, location of the resistive elements and ink feed slots relative to the alignment holes is easier. As with the previously described embodiment of the invention, an increase in yield of useable product is expected by use of this alternative fabrication procedure.

In yet another preferred embodiment, a double-side polished silicon wafer substrate containing thermally oxidized layers on a first and second surface thereof is coated on the first oxidized surface with a mask layer and is coated on the second oxidized surface with one or more resistive, conductive and insulative layers which are patterned then coated with a blanket protective coating of a material selected from SiC, $Si_3N_4$, $SiO_2$ and the like. After depositing the protective coating on the second surface, a portion of the mask layer and thermally oxidized layer on the first surface is removed in a predefined pattern thereby defining the ink feed slot positions. In order to position the feed slot locations, an infrared (IR) mask aligner is used whereby the patterned layers on the second surface of the substrate are used for alignment. Once the feed slot positions on the first surface have been defined, the silicon substrate is anisotropically etched from the first surface to the oxidized layer on the second surface of the substrate. Any remaining blanket protective coating and oxidized layer on the second surface may then be removed using wet or dry etching techniques thereby completing the ink feed slots through the substrate.

A particular advantage of the foregoing methods is that the feed slot may be etched through the substrate in one anisotropic etching step using only one alignment step. Since at least one masking and aligning step is eliminated when using any of the foregoing methods, the yield of usable product is expected to be relatively higher than the yield from techniques requiring multiple masking and alignment steps.

BRIEF DESCRIPTION OF THE DRAWINGS

Further objects and advantages of the invention, and the manner of their implementation, will become apparent upon reading the following detailed description with reference to the drawings in which like reference numerals denote like elements throughout the drawings and wherein:

FIGS. 1A–1G are cross-sectional views, not to scale, of a portion of the silicon wafer depicting one process for producing ink feed slots in a silicon substrate.

DETAILED DESCRIPTION

Figure 1A:
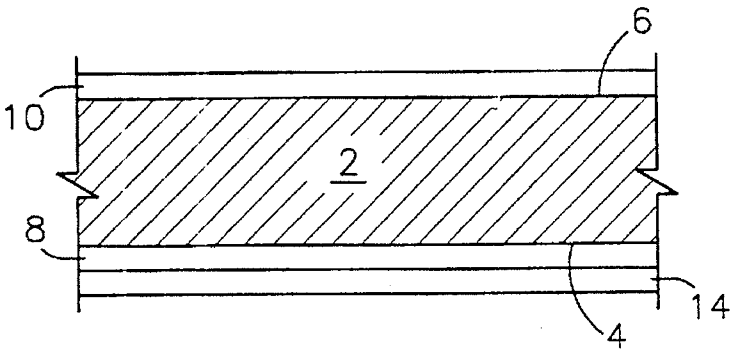

With reference to FIG. 1A, there is illustrated a cross-sectional view, not to scale, of a portion of a single crystal silicon wafer substrate 2 having a first (100) crystallographic planar surface 4 and a second (100) crystallographic planar surface 6. Prior to etching the silicon substrate to form the ink feed slots, a dielectric layer 10 is deposited on the second surface 6 and a mask layer 8 is deposited on the first surface 4 by well known chemical vapor deposition or oxidation techniques. The mask layer 8 and dielectric layer 10 may be selected from $Si_3N_4$, $SiO_2$, SiC and the like with the preferred materials being $Si_3N_4$ for the mask layer and $SiO_2$ for the dielectric layer. The thickness of the mask and dielectric layers is about 0.5 to about 5 microns, preferably 1–2 microns. While only a mask layer 8 is illustrated in the Figures, it will be recognized that the first surface 4 may contain a dielectric layer of $SiO_2$ below the mask layer 8.

Subsequent to depositing the mask and dielectric layers on the surfaces of the silicon substrate, the second surface is preferably polished so that a standard mask aligner may be used to locate the position for the patterning the resistive, conductive and insulative materials which are deposited on the second surface. The standard mask aligner uses a white light for transmission of light through the substrate from the first surface to the second surface in a technique referred to as "back side alignment".

Figure 1B:
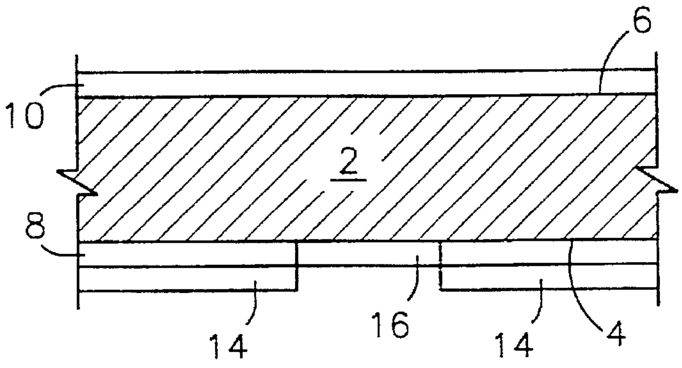
Figure 1C:
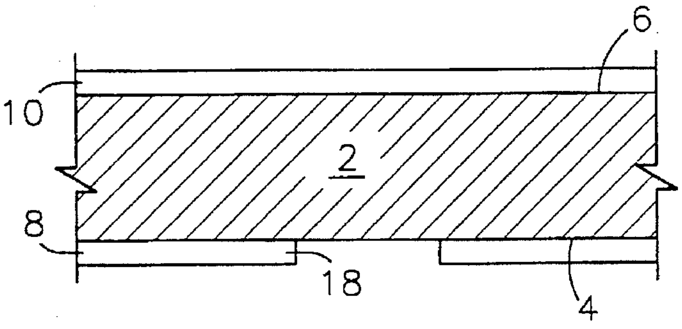

A photoresist layer 14 is deposited on the first surface over the mask layer 8. A select portion of the photoresist layer 14 is patterned then developed to expose a portion 16 of the underlying mask layer 8 to be removed (FIG. 1B). The exposed portion 16 of the mask layer may be removed by suitable wet or dry etching techniques thereby forming one or more elongate marks 18 (FIG. 1C) in the mask layer 8, the marks having a length of from about 3 to about 5 millimeters and a width of from about 0.5 to about 2 millimeters. Suitable etching techniques for forming the elongate marks 18 include plasma or a wet-etch process such as a buffered hydrofluoric acid solution. Once the elongate marks have been formed, the remaining photoresist material may be removed as illustrated in FIG. 1C. Techniques for removal of the photoresist layer 14 include acids, organic solvents such as acetone and chemical combustion in an oxygen glow discharge chamber.

Figure 1D:
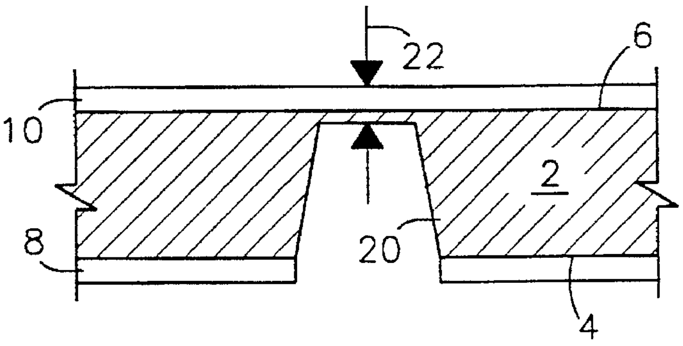

An important feature of the process of the invention is the partial anisotropic etch of the silicon substrate 2 as illustrated in FIG. 1D. In this step, one or more elongate ink feed slots 20 are anisotropically etched in the silicon substrate 2 from the first surface 4 until a portion of the substrate between the etched feed slots and the dielectric layer 10 remains. The amount of silicon substrate remaining between the etched feed slots and the dielectric layer 10 may range from about 5 microns in thickness to about 30 microns in thickness. It is preferred, however, that the anisotropic etching process be conducted until no more than about 20 microns, most preferably about 10 microns of silicon substrate and dielectric layer 10 remain as represented by arrows 22.

The remaining silicon substrate in feed slot 20 between arrows 22 provides significant structural integrity to the substrate and reinforces the dielectric layer 10 over the feed slot area so that the dielectric layer 10 remains substantially intact in subsequent processing steps. Accordingly, a higher yield of usable substrate may be obtained by use of the foregoing method.

Any known anisotropic etchant may be used. The preferred anisotropic etchants may be selected from an aqueous alkaline solution and an aqueous mixture of phenol and amine. Of the aqueous alkaline solutions, a potassium hydroxide solution is the most preferred. Other anisotropic etchants include sodium hydroxide, a mixture of hydrazine and tetramethyl ammonium hydroxide and a mixture of pyrocatechol and ethylene diamine.

Prior to completing the etch of the one or more feed slots 20, the device side of the substrate is completed by depositing and patterning of one or more layers of resistive material, conductive material and insulative material. Positioning and patterning of the resistive, conductive and insulative materials is achieved by use of the white light from a standard mask aligner which illuminates the partially etched feed slot 20 so that the edges of the feed slot can be seen from the device side.

The resistive material which is patterned to define the heating elements 24 may be doped polycrystalline silicon, $HfB_2$ or other well known resistive material, the resistive material having a thickness of about 500 to about 2000 Å, preferably about 1000 Å which may be deposited on the dielectric layer 10 on surface 6 of the substrate by a suitable thin film deposition technique such as chemical vapor deposition (CVD), plasma enhanced chemical vapor deposition (PECVD), sputtering and the like.

The conductive material 28 and 30 comprising common energizing and return electrodes for the heating elements may be aluminum leads deposited over the edges of the heating elements 24. For protection and electrode passivation during the feed slot etching step, one or more protective layers 26 may be deposited over the heating elements and electrodes. Protective layers 26 may be selected from SiC, $Si_3N_4$, $SiO_2$ or phosphorus doped CVD $SiO_2$ or a combination of two or more of the foregoing materials so that the total thickness of the protective layer is about 0.1 to about 2 microns, preferably about 0.5 microns.

After depositing, locating and patterning the resistive, conductive, insulative and protective materials on the second surface, the anisotropic etch of the feed slots 20 up to the dielectric layer 10 on the second surface 6 is completed as illustrated in FIG. 1F. Finally, the portion of the dielectric layer 10 lying over the completed feed slot 20 is removed as well as any protective layers 26. The order for removal of the dielectric layer 10 over the feed slot 20 and protective layers 26 on the second surface is not important to the invention and may be conducted in any order.

The dielectric layer 10 and protective layers 26 may be removed by reactive ion etching (RIE), abrasion, laser ablation, air blast, water blast or any other well known technique. RIE etching may be conducted using $CF_4$, $CF_3Cl$, $C_2F_5Cl$, $CCl_4$, $SF_6$, $CHF_3$ or a combination of two or more of the foregoing plasma gases. A cross-sectional view of a completed feed slot 20 in the silicon substrate 2 having device side features adjacent thereto is illustrated in FIG. 1G.

In an alternative to the foregoing procedure, when both surfaces of the silicon substrate are polished, an infrared (IR) mask aligner rather than a standard mask aligner may be used to position and pattern the device side elements. Use of an IR mask aligner allows there to be a greater thickness of substrate remaining between the partially etched feed slot and the dielectric layer 10 on the second surface, thereby providing greater structural integrity to the dielectric layer 10. Thicknesses of up to about 20 microns or more may not impair alignment when using an IR mask aligner.

Regardless of the mask alignment light source used, the foregoing embodiment reduces the need for alignment holes which are used for aligning the feed slots and for positioning the resistive, conductive and insulative materials on the device side. Hence, at least one alignment, masking and etching step is eliminated by the foregoing process in contrast to other well known printhead fabrication techniques.

Figure 2:
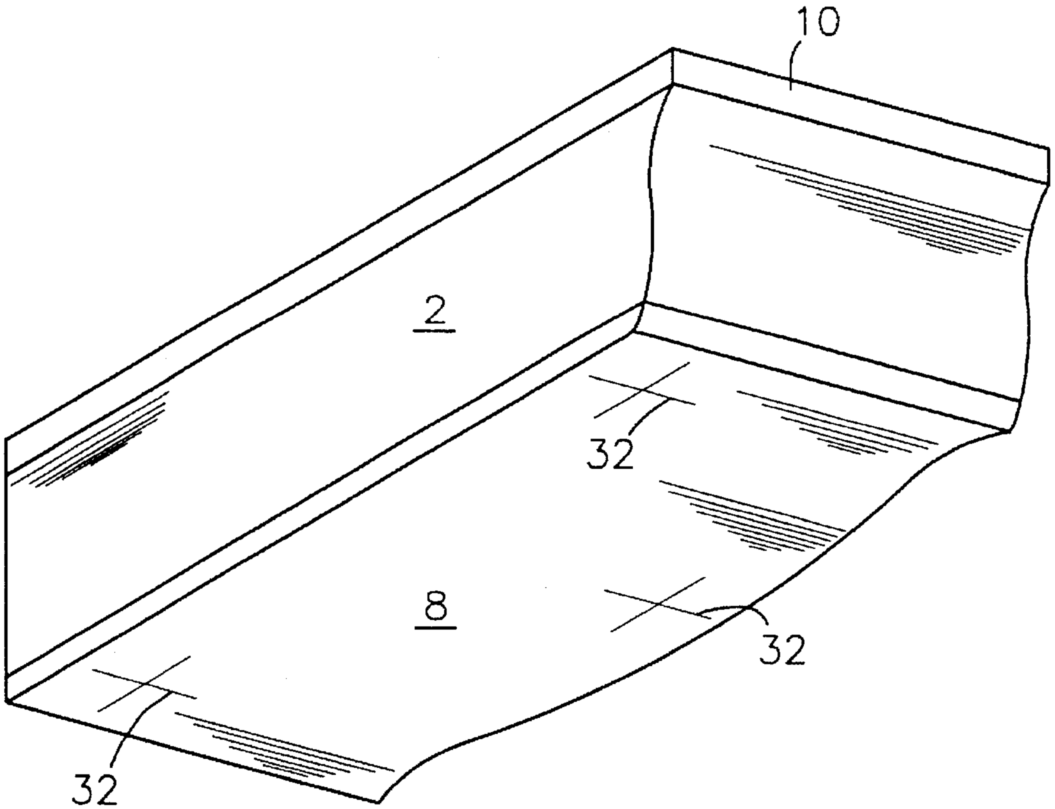
FIG. 2 is a bottom perspective view, not to scale, of the first oxidized surface of a silicon substrate illustrating the use of thin metal alignment marks for another embodiment of the invention.

In yet another alternative to the foregoing procedure, prior to coating the first surface of a double-side polished silicon wafer substrate with the photoresist material 14, intersecting strips of a thin metal 32 selected from Al, Ta or other suitable material may be deposited on the first mask layer 8 of the silicon wafer substrate as illustrated by FIG. 2. The intersecting strips 32 are preferably deposited in two or more locations, preferably 3 or more locations in a cross-hair pattern on the mask layer 8 on the first surface of the substrate.

Next, the resistive, conductive and insulative material is deposited and patterned on the second surface of the substrate as illustrated and described above with reference to FIGS. 1E through 1G. In order to position the devices on the second surface, a back side IR mask alignment technique is used to locate the devices on the second surface in relation the metal strips on the first surface.

Finally, the elongate slots are patterned and etched from the first surface to the second surface in a single etching step and the feed slot is completed as described above. Since the metal strips are on the first side of the substrate, there is no need to remove these strips once the feed slots are completed.

Figures 3A, 3B, 3C:
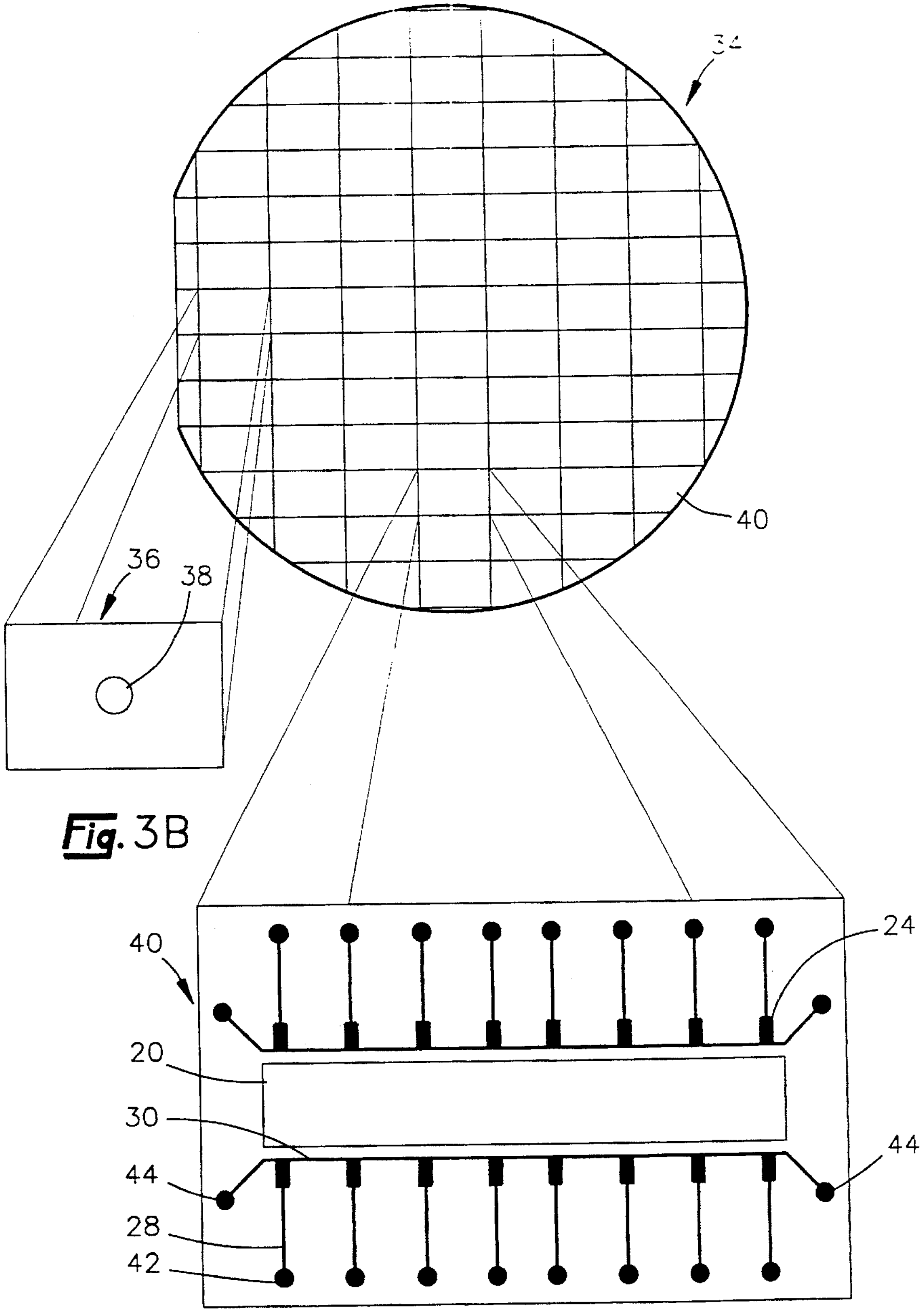
FIG. 3A is an enlarged schematic plan view, not to scale, of a silicon wafer substrate containing a plurality of heating element substrates and a predetermined number of substrates containing an alignment hole according to another embodiment of the invention.
FIG. 3B is an enlarged schematic plan view, not to scale, of one of the substrates of FIG. 3A containing an alignment hole.
FIG. 3C is an enlarged schematic plan view, not to scale, of one of the heating element substrates of FIG. 3A.

In FIG. 3A–3C, another alternative embodiment of the invention is illustrated. A fully processed silicon wafer 34, containing a plurality of alignment hole sections 36 containing one or more alignment holes 38 and a plurality of ink-jet printhead structures 40 having an ink feed slot 20, adjacent heating elements 24, energizing electrodes 28, energizing electrode terminals 42, common return circuit 30, and common return terminals 44 is illustrated.

Figure 4A:
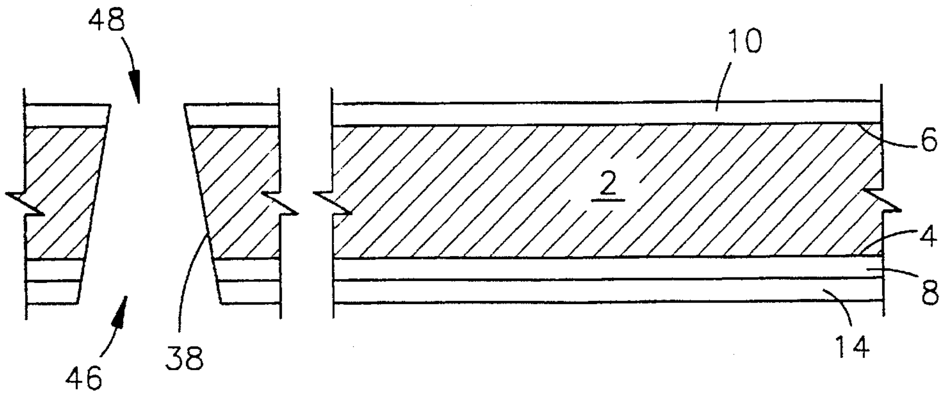
FIGS. 4A–4G are cross-sectional views, not to scale, of a portions of the silicon wafer depicting an alternative process for producing ink feed slots in a heating element substrate.

Now with reference to FIGS. 4A–4G, the fabrication procedure for the alternative embodiment of FIGS. 3A–3C of the invention is illustrated. In FIG. 4A, a silicon wafer substrate having mask layer 8 and dielectric layer 10 as described above has a photoresist layer 14 deposited on the mask layer 8 on the first surface 4 of the substrate. The photoresist layer has a thickness of about 1 to about 2 microns. Next, a plurality of alignment holes 38, preferably at least about three or more, are drilled at spatially separate locations in the silicon wafer substrate 34 (FIG. 3A) using a laser beam. The holes are preferably drilled around the periphery of the wafer in an area of the wafer that is remote from sections which may be used in the printheads.

Any suitable laser beam source may be used to drill the holes. A preferred laser beam source is a Q-Switched YAG laser. Another preferred laser beam source is an aligned-optics two beam eximer laser. Lasers having sufficient power for drilling holes in the substrate include models MEL-40 and LMS having 8 to 50 watts of power which are commercially available from Florod of Gardena, Calif. Lumonics of Camarillo, Calif. may also provide suitable lasers for drilling the substrate.

The laser drilled holes 38 preferably have an entry 46 on the first surface 4 of the silicon substrate of from about 5 to about 100 microns, preferably about 50 microns and an exit 48 on the second surface 6 of the silicon substrate 2 having a diameter of from about 5 to about 50 microns, preferably about 25 microns. Larger or smaller alignment holes may be drilled in the silicon substrate, however for ease of alignment, the foregoing entry and exit hole sizes are preferred.

When using a Q-switched YAG laser, the entry hole 46 will often be larger than the exit hole 48 with a 25 micron hole being about the smallest hole which may be cut using the YAG laser. However, the smaller the hole the greater the accuracy of alignment which can be obtained, provided the hole is large enough to be visible to the aligner.

Figure 4B:
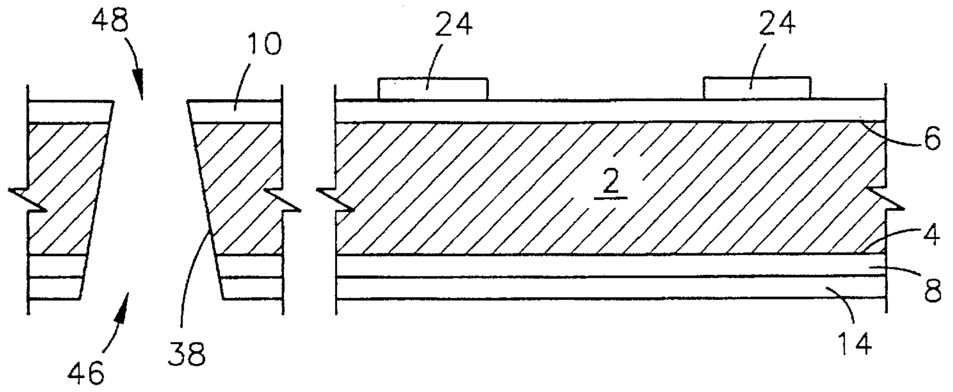

One or more layers of resistive material 24 may then be deposited and patterned on the dielectric layer 10 using the alignment holes 38 to determine the position for depositing and patterning the resistive material 24 as illustrated in FIG. 4B. As in the previous embodiment, the layers of resistive material 24 are used as the heating elements for vaporizing an ink component and will generally have a thickness of about 1000 Å. Resistive material which may be used includes doped polycrystalline silicon which may be deposited by chemical vapor deposition (CVD) or any other well known resistive material such as $HfB_2$ or TaAl.

Figure 4C:
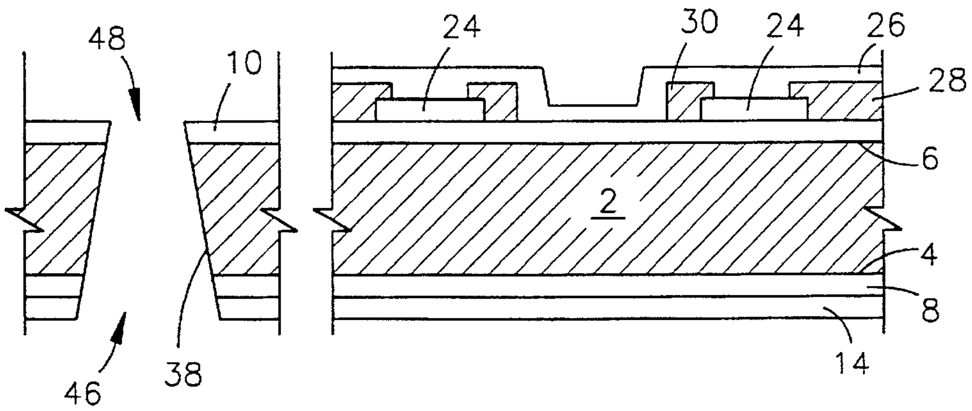

The heating elements 24 are energized by a plurality of electrodes 28 and 30 formed from one or more conductive layers deposited on the dielectric layer 10 in contact with the resistive material 24 for conduction of electrical pulses to the individual heating elements (FIG. 4C). Electrodes 28 and 30 may be formed from vapor deposited aluminum or sputtered Al/Cu alloy and will typically have a thickness of about 5000 Å.

In order to protect the resistive material 24 and electrodes 28 and 30 during subsequent processing steps, it is preferred to deposit a blanket protective coating 26 over the resistive material 24 and electrodes 28 and 30 on the dielectric layer 10. The protective coating may be deposited or grown using any of the well known chemical vapor deposition techniques. Suitable protective coatings include $Si_3N_4$, $SiO_2$, SiC and the like with the preferred being $Si_3N_4$ and SiC. The total thickness of the protective coating is preferably about 5000 Å.

Figure 4D:
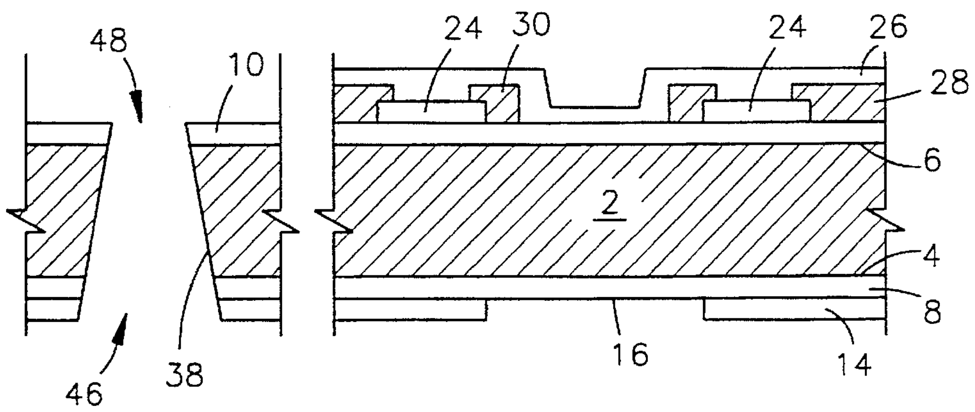
Figure 4E:
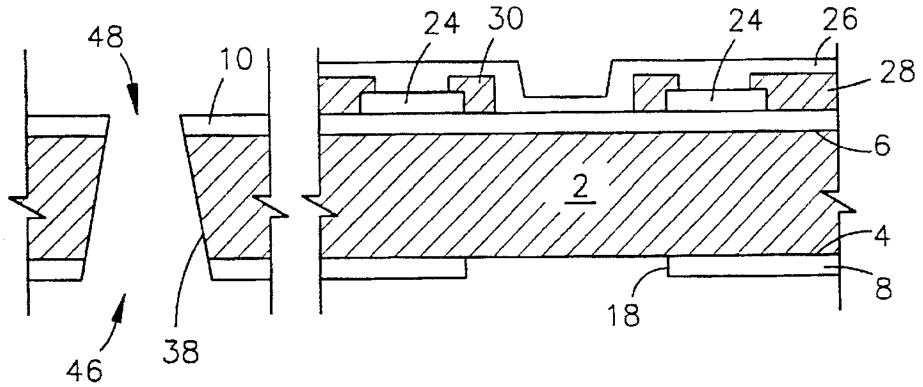

Subsequent to protectively coating the resistive material 24 and electrodes 28 and 30, select portions of the photoresist layer 14 are patterned and developed thereby exposing a portion 16 of the mask layer 8 (FIG. 4D). The positioning of the photoresist mask used to expose the portion 16 of the mask layer 8 is determined by reference to the previously drilled alignment holes 38. The exposed portion 16 of the mask layer 8 may then be etched away using a plasma or wet-etch process such as a buffered hydrofluoric acid solution thereby forming a plurality of elongate marks 18 in the mask layer 8. After forming the elongate marks 18, the photoresist layer 14 is removed by means of acids, organic solvents such as acetone or chemical combustion in an oxygen glow discharge chamber (FIG. 4E).

Figure 4F:
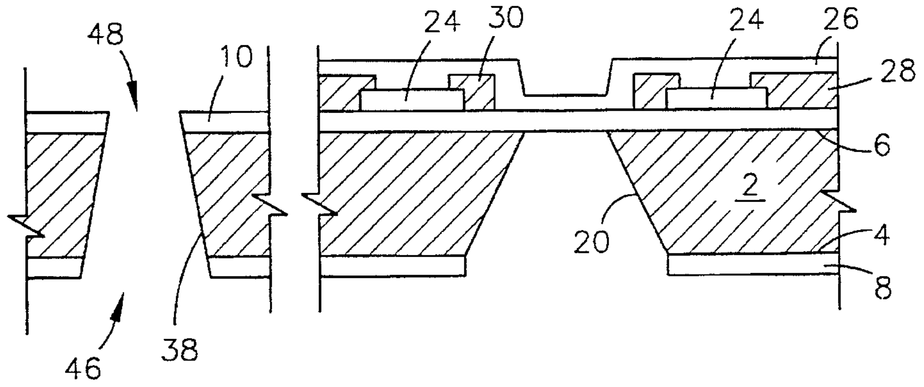

Once the elongate marks 18 are formed in the mask layer 8, the silicon substrate 2 is anisotropic etched from the planar (100) crystallographic surface 4 to form a plurality of elongate ink feed slots 20 (FIG. 4F). Any known anisotropic etchant may be used. The preferred anisotropic etchants may be selected from an aqueous alkaline solution and an aqueous mixture of phenol and amine. Of the aqueous alkaline solutions, a potassium hydroxide solution is the most preferred. Other anisotropic etchants include sodium hydroxide, a mixture of hydrazine and tetramethyl ammonium hydroxide and a mixture of pyrocatechol and ethylene diamine.

Since processing of the second surface of the silicon substrate is substantially complete prior to the anisotropic etching step, the etching step may be conducted until the feed slot 20 reaches the dielectric layer 10 on the second surface 6 of the substrate 2.

Figure 4G:
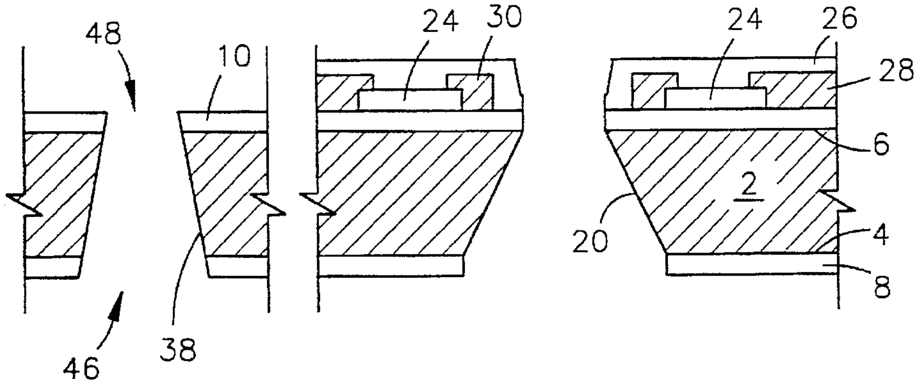

In order to complete the fabrication of the printhead structure, the protective coating 26 over the resistive, conductive and insulative materials is removed by RIE etching techniques until the Ta over the resistive material and the Al on the conductive material is exposed. At this point, there still remains a thin layer of protective material 26 and dielectric layer 10 over the feed slot 20 which may be removed by abrasion, laser ablation, air blast, water blast or any other well known technique. The completed elongate feed slot 20 is illustrated in FIG. 4G.

Using the foregoing methods, at least one of the photoresist masking and developing steps is eliminated as compared to conventional processing techniques. Since each time the photoresist layer is formed, developed and the etch masks used, there is an opportunity for alignment errors, elimination of at least one of the photoresist masking steps should result in a substantial increase in yield of useable printhead chips.

Figure 5A:
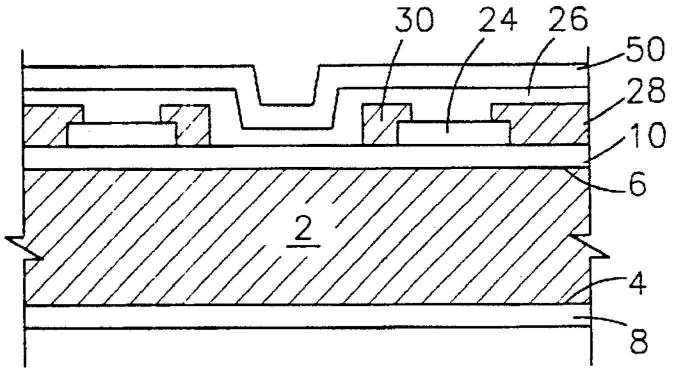
FIGS. 5A–5E are cross-sectional views, not to scale, of a portion of the silicon wafer depicting another alternative process for producing ink feed slots in the heating element substrate.
Figure 5B:
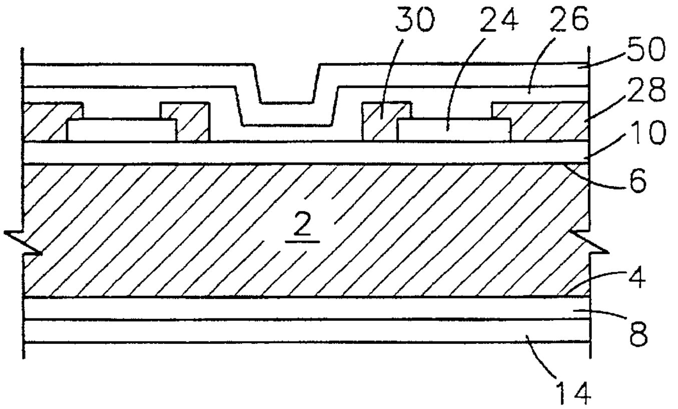
Figure 5C:
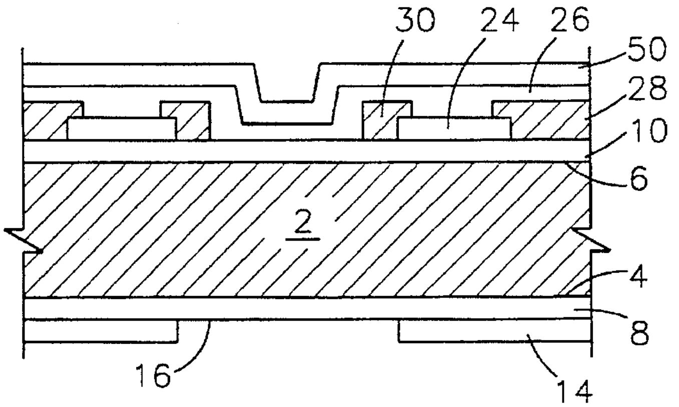
Figure 5D:
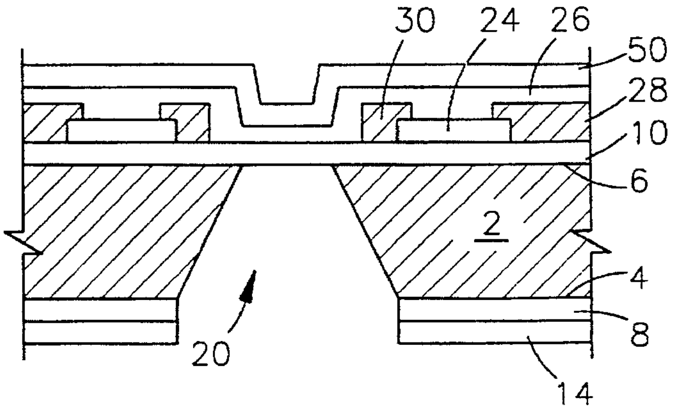

In the embodiment illustrated by FIGS. 5A–5E, a double-side polished silicon wafer substrate 2 containing a mask layer 8 on a first surface and a thermally oxidized dielectric layer 10 on a second surface thereof is coated on the second dielectric surface with one or more resistive, conductive and insulative layers which are completely patterned then coated with a blanket protective coating 50 of a material selected from SiC, $Si_3N_4$, $SiO_2$ and the like. After depositing the protective coating 50, a photoresist layer 14 is deposited on the mask layer 8 on the first surface (FIG. 5B). The photoresist layer 14 is then patterned and developed to expose a portion 16 of the mask layer 8 thereby defining the ink feed slot positions. In order to position the feed slot locations, an infrared (IR) mask aligner is used whereby the patterned layers of resistive, conductive and insulative materials on the second surface are used for location and alignment of the feed slots.

Figure 5E:
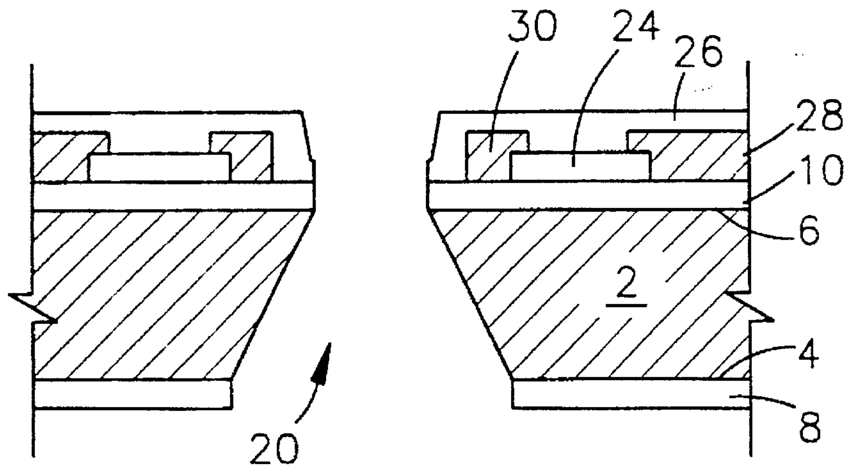

Once the feed slot positions 16 on the first surface have been defined, the silicon substrate is anisotropically etched from the first surface to the dielectric layer 10 on the second surface of the substrate thereby forming feed slots 20. Upon completion of the etching step, any remaining blanket protective coating 50 on the second surface may then be removed using wet or dry etching techniques thereby completing the ink feed slots through the substrate 2, and the photoresist layer 14 may be removed as described above. The feed slots 20 may then be opened from the first surface to the second surface by abrasion, laser ablation, air blast, water blast or any other well known technique sufficient to remove any remaining thin film or layers over the feed slot locations as illustrated by FIG. 5E.

Completion of any or all of the printhead structures described in the foregoing processes, including forming the nozzles structures above the resistive, conductive and insulative materials may be conducted using conventional processing techniques.

Having thus described various preferred embodiments of the invention and several of its benefits and advantages, it will be understood by those of ordinary skill that the foregoing description is merely for the purpose of illustration and that numerous substitutions and modifications may be made in the invention without departing from the scope and spirit of the appended claims.

What is claimed is:

1. A method for making ink feed slots in a single crystal silicon wafer substrate having first and second (100) crystallographic surfaces for fluid communication between an ink reservoir and one or more ink feed channels leading to electrical resistance elements on an ink-jet printhead comprising:

oxidizing at least the second surface of the silicon wafer substrate;

coating the first surface of the substrate with a mask layer;

depositing a layer of photoresist material on the mask layer;

patterning and developing the photoresist layer thereby defining one or more ink feed slot locations;

removing the mask layer on the first surface of the silicon substrate in an ink feed slot location thereby defining one or more ink feed slot positions;

anisotropically etching one or more feed slots in the silicon wafer substrate wherein the mask layer has been removed with an anisotropic etchant from the first surface partially through the substrate so that no more than about 30 microns of substrate and oxidized layer remains between the etched slots and the second oxidized surface of the substrate;

depositing and patterning one or more layers of resistive material, conductive material and insulative material on the second oxidized surface of the substrate;

coating the one or more layers of resistive, conductive and insulative materials with a protective coating of a passivation material;

completing the anisotropic etch of the feed slot; and removing any remaining protective coating and oxidized layer over the etched feed slots on the second surface of the silicon substrate.

2. The method of claim 1 wherein only the second surface of the substrate is polished.

3. The method of claim 2 wherein the partially etched feed slots are used for alignment and patterning of the resistive, conductive and insulative materials on the second surface of the substrate.

4. The method of claim 3 wherein a standard mask aligner with a white light is used.

5. The method of claim 1 wherein the partially etched feed slots are used for alignment and patterning of the resistive, conductive and insulative materials on the second surface of the substrate.

6. The method of claim 1 wherein the anisotropic etchant is selected from an aqueous alkaline solution and an aqueous mixture of a phenol and an amine.

7. The method of claim 1 wherein the mask layer is $Si_3N_4$.

8. The method of claim 1 further comprising polishing the first and second surfaces of the substrate and using the partially etched feed slots for alignment and patterning of the resistive, conductive and insulative materials on the second surface of the substrate by means of an infrared mask aligner.

9. The method of claim 1 further comprising, before depositing the photoresist material on the mask layer on the first surface of the substrate, depositing intersecting strips of thin metal in a plurality of locations on the first surface of the substrate to use for back side alignment of the resistive, conductive and insulative materials.

10. The method of claim 9 wherein the alignment is conducted using an infrared mask aligner.

11. A process for forming one or more ink feed slots in a single crystal silicon substrate comprising:

thermally oxidizing a first planar surface and a second planar surface of the single crystal silicon substrate having (100) crystallographic orientations thereby forming oxidized first and second layers;

coating the oxidized first layer with a mask layer;

depositing a layer of photoresist material on the mask layer;

exposing an area of the photoresist material to an ultraviolet light to define a feed slot pattern in the photoresist material;

removing a portion of the mask layer and oxidized first layer according the defined feed slot pattern;

etching the silicon substrate from the first surface of the substrate with an anisotropic etchant to partially complete the one or more feed slots in the substrate according to the feed slot pattern whereby from about 5 to about 10 microns of substrate and oxidized second layer remain between the etched slot and the second surface of the substrate;

depositing one or more layers of resistive material, conductive material and insulative material on the second surface of the oxidized substrate;

completing the anisotropic etch of the feed slot up to the oxidized second layer on the second surface of the substrate; and removing any remaining oxidized second layer on the second surface of the substrate covering the etched feed slot.

12. The process of claim 11 wherein the partially etched feed slots are used to align the layers of resistive, conductive and insulative materials on the second surface of the substrate.

13. The process of claim 11 wherein the anisotropic etchant is selected from an aqueous alkaline solution and an aqueous mixture of a phenol and an amine.

14. The process of claim 11 wherein the aqueous alkaline solution is aqueous potassium hydroxide.

15. The process of claim 11 wherein the remaining oxidized second layer on the second surface is removed by an air jet blast, laser ablation or a buffered hydrofluoric acid solution.

16. The method of claim 11 wherein the mask layer is $Si_3N_4$.

17. A method for fabricating a topshooter type thermal ink-jet printhead for use in an ink-jet printing device, comprising the steps of:

drilling a plurality of alignment holes through a silicon wafer substrate having oxidized layers on the first and second surfaces using a laser beam, each hole having an entry on a first surface of the substrate having a diameter of from about 5 to about 100 microns and an exit on a second surface of the substrate having a diameter of from about 5 to about 50 microns;

depositing one or more layers of resistive material, conductive material and insulative material on the oxidized second surface of the substrate using the alignment holes for aligning and patterning the resistive, conductive and insulative materials;

passivating the resistive, conductive and insulative materials on the second surface of the substrate with one or more passivation layers;

coating the passivated surface with a protective blanket layer;

coating the first oxidized surface with a mask layer;

patterning a plurality of elongate marks on the oxidized first surface of the substrate using the alignment holes to pattern the marks;

anisotropically etching the substrate according to the patterned marks on the first surface thereby producing a plurality of elongate slots from the first surface to the second surface which terminate at the oxidized layer on the second surface;

removing the protective blanket layer and oxidized layer on the second surface thereby completing the elongate feed slots from the first surface to the second surface of the substrate.

18. The method of claim 17 wherein the anisotropic etchant is selected from an aqueous alkaline solution and an aqueous mixture of a phenol and an amine.

19. The method of claim 17 wherein the entry on the first surface is about 50 microns in diameter.

20. The method of claim 17 wherein the exit on the second surface is about 25 microns in diameter.

21. A method for anisotropically etching feed slots in a silicon wafer substrate comprising:

thermally oxidizing at least a second surface of the substrate;

coating the oxidized second surface with one or more resistive, conductive and insulative layers;

patterning the resistive, conductive and insulative layers;

depositing a blanket protective coating on the second surface over the resistive, conductive and insulative layers;

depositing a mask layer on the first surface of the substrate;

removing a portion of the mask layer on the first surface in a pattern thereby defining one or more ink feed slot positions; and anisotropically etching the first surface in the feed slot positions to the oxidized second surface thereby forming one or more ink feed slots.

22. The method of claim 21 wherein the silicon wafer substrate is double-side polished.

23. The method of claim 22 wherein the ink feed slot positions are determined using an infrared mask aligner.

24. The method of claim 21 wherein the anisotropic etchant is selected from an aqueous alkaline solution and an aqueous mixture of a phenol and an amine.

* * * * *